United States Patent
Koifman et al.

(10) Patent No.: US 9,813,076 B1
(45) Date of Patent: Nov. 7, 2017

(54) ANALOG TO DIGITAL CONVERTER AND A METHOD FOR ANALOG TO DIGITAL CONVERSION

(71) Applicant: Analog Value Ltd., Rishon Lezion (IL)

(72) Inventors: Vladimir Koifman, Rishon Lezion (IL); Tiberiu Galambos, Binyamina (IL); Anatoli Mordakhay, Hadera (IL)

(73) Assignee: ANALOG VALUE LTD., Reshon Lezion (IL)

( * ) Notice: Subject to any disclaimer, the term of this patent is extended or adjusted under 35 U.S.C. 154(b) by 0 days.

(21) Appl. No.: 15/472,277

(22) Filed: Mar. 29, 2017

Related U.S. Application Data (60) Provisional application No. 62/315,695, filed on Mar. 31, 2016.

(51) Int. Cl.
  *H03M 1/12* (2006.01)
  *H03M 1/10* (2006.01)
(52) U.S. Cl.
  CPC ....... *H03M 1/1245* (2013.01); *H03M 1/1009* (2013.01)
(58) Field of Classification Search
  CPC .... H03M 1/1245; H03M 1/1009; H03M 1/12; H03M 1/00; H03M 1/14
  USPC .................................................. 341/131, 155
  See application file for complete search history.

(56) References Cited

U.S. PATENT DOCUMENTS 5,790,063 A * 8/1998 Koifman ............... H03M 3/348
  341/155
5,889,482 A * 3/1999 Zarubinsky ............. H03M 3/33
  341/131

* cited by examiner

*Primary Examiner* — Jean B Jeanglaude
(74) *Attorney, Agent, or Firm* — Reches Patents (57) ABSTRACT

An ADC that may include a sampler that generates a series of current pulses; a group of charge memory units; a de-multiplexor for providing charge packets that reflect the series of current pulses to the group; at least one controller that causes different charge memory units of the group to receive charge packets from different current pulses during reception periods that start and end at points of tome outside the current pulses, a group of PWM modulators that are configured to generate PWM pulses that represent the charge packets stored by the group of charge memory units; and a processor that is configured to generate an output digital signal that represents the input analog signal based on the PWM pulses.

20 Claims, 12 Drawing Sheets

ANALOG TO DIGITAL CONVERTER AND A METHOD FOR ANALOG TO DIGITAL CONVERSION

CROSS REFERENCE

This application claims priority from U.S. provisional patent Ser. No. 62/315,695 filing date Mar. 31 3016 which is incorporated herein by reference.

BACKGROUND

Analog to digital converter convert analog signals to digital signals.

There is a growing need to provide a highly accurate and efficient analog to digital converter.

SUMMARY

According to an embodiment of the invention there may be provided a method and an analog to digital converter that may include a sampler that is configured to sample an input analog signal to generate a series of current pulses; a group of charge memory units; a de-multiplexor that is configured to provide charge packets that reflect the series of current pulses to the group of charge memory units; at least one controller for controlling the group of charge memory units thereby causing different charge memory units of the group to receive charge packets from different current pulses; wherein each charge memory unit is configured to receive a charge packet related to given current pulse during a reception period that (a) starts at a start point of time that precedes the given current pulse and occurs between the current pulses, and (b) ends at an end point of time that follows the given current point of time and occurs between the current pulses; a group of pulse width modulation (PWM) modulators that are coupled to the group of charge memory units and are configured to generate PWM pulses that represent the charge packets stored by the group of charge memory units; and a processor that is configured to generate an output digital signal that represents the analog input signal based on the PWM pulses.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

The following abbreviations/symbols are used in the specification or drawings:
 a. ADC—analog to digital converter.
 b. CM—charge memory unit.
 c. CM and PWM Mod—charge memory unit and PWM modulator.
 d. De-Mux—de-multiplexor.
 e. N—a positive integer that exceeds 1 and may exceed 30, 120 and the like.
 f. PWM—Pulse width modulation. PWM is a modulation scheme that converts an input signal to an output pulse. The width of the pulse represents the value of the input signal.

g. PWM Mod—PWM modulator.

h. Vgs—gate source voltage (of a transistor).

i. Thermo Encoder—a logic circuit that may include but is not limited to a thermometer code to binary code encoder.

According to various embodiment of the invention there is provided an analog to digital converter in which an analog current is sampled by a sampler (that is controlled by a sampler clock signal) to generate a series of current pulses.

Charge packets that reflect the series of current pulse are fed through a de-multiplexor to a group of charge memory units, and are stored at a group of charge memory units.

Control signals of different charge memory units are shifted from each other so that different charge memory units receive charge packets from different current pulses.

Each charge memory unit may receive a charge packet related to given current pulse during a reception period that (a) starts at a start point of time that precedes the given current pulse and occurs between current pulses, and (b) ends at an end point of time that follows the given current point of time and occurs between current pulses.

The timing the start and end of the reception period to be between current pulses prevents the start and the end of the reception period affect the sampling instances that are solely defined by the sampler clock signal.

This eliminates the need to perform timing calibration that for other time interleaved ADC architectures is one of the most complex calibration task.

Figure 1:
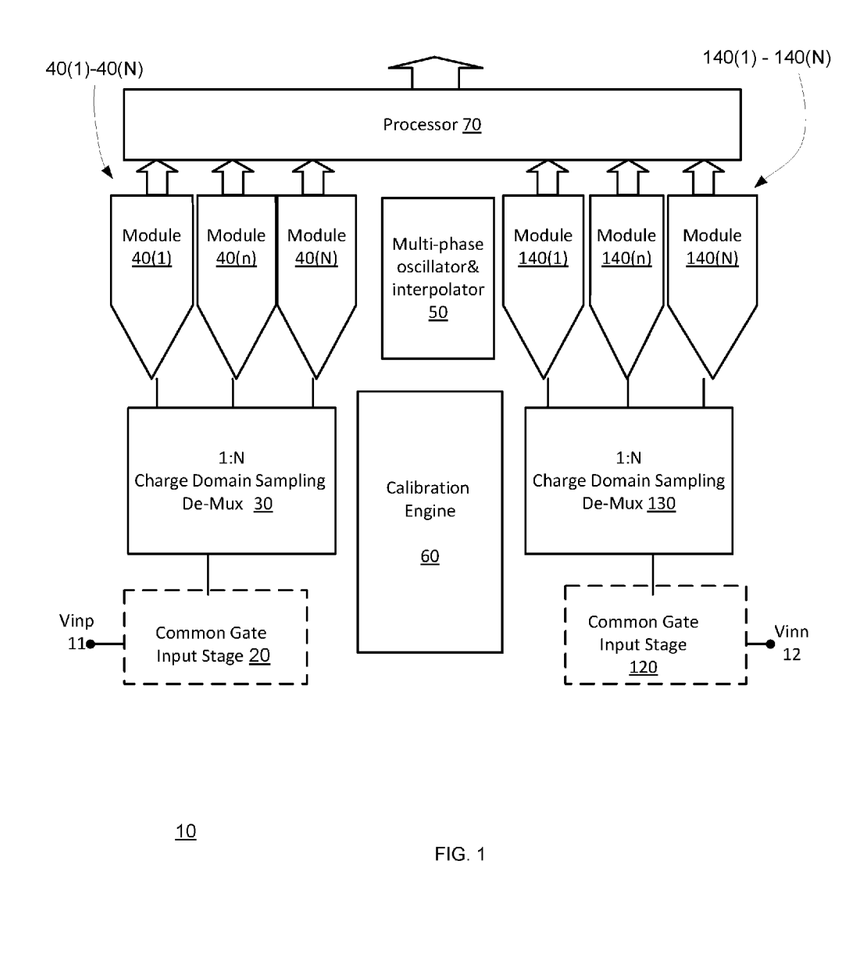
FIG. 1 illustrates an analog to digital converter according to an embodiment of the invention.
Figure 2:
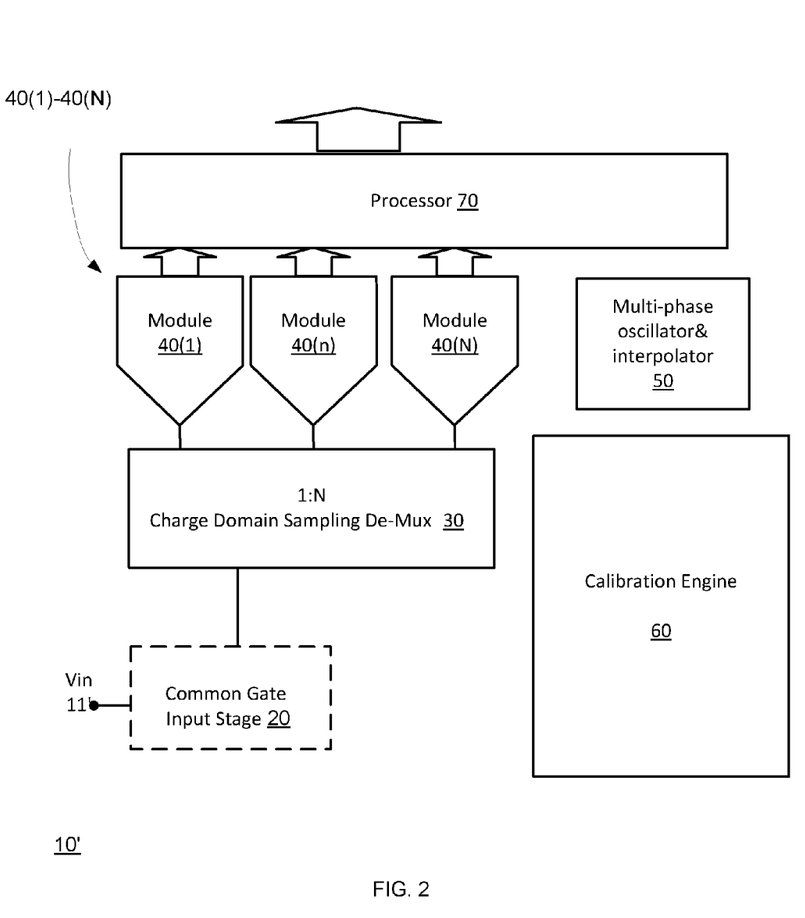
FIG. 2 illustrates an analog to digital converter according to an embodiment of the invention.

FIGS. 1 and 2 illustrates ADCs 10 and 10' respectively according to an embodiment of the invention.

ADC 10 of FIG. 1 is a differential ADC that receives differential input signals Vinp 11 and Vinn 12 and output a signal that is indicative of a difference between Vinp 11 and Vinn 12.

ADC 10' of FIG. 2 is a non-differential ADC that receives input signal Vin 11' and outputs a signal that is indicative of Vin 11'.

Referring back to FIG. 1—common gate input stage 20 converts Vinp 11 to a current signal that is fed to 1:N charge domain sampling de-multiplexer 30.

The 1:N charge domain sampling de-multiplexer 30 includes a sampler that is fed by a sampler clock signal and a 1 to N de-multiplexer.

The charge domain sampling de-multiplexer 30 distributes (de-multiplexes) the current signal to N modules 40(1)-40(N).

Figure 3:
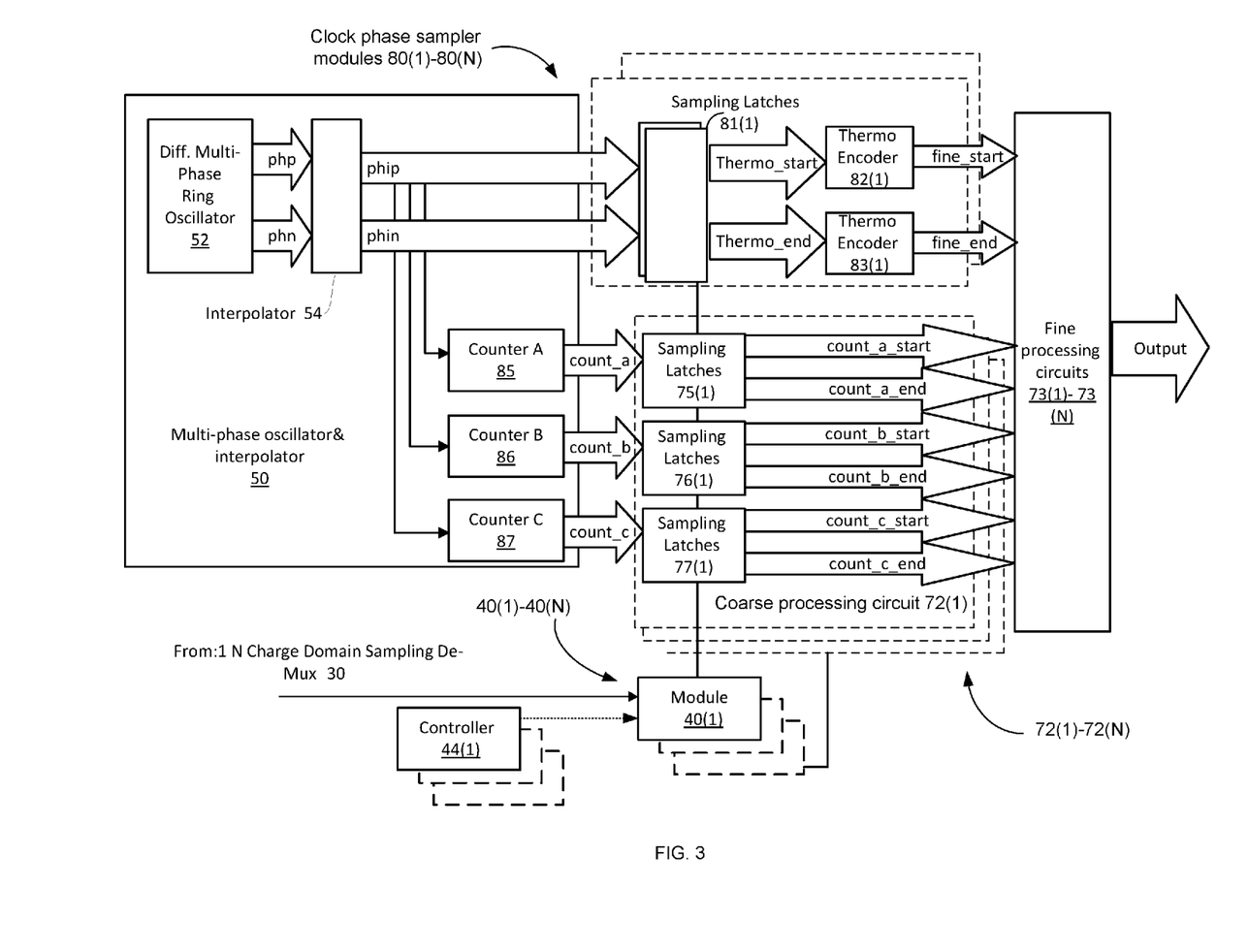
FIG. 3 illustrates circuits of an analog to digital converter according to an embodiment of the invention.

Each module may include, for example, charge memory cells, PWM modulators, sampling latches first processing circuits and second processing circuits—such as those illustrated in FIG. 3.

Common gate (or other type) input stage 120 converts Vinn 12 to a current signal that is fed to 1:N charge domain sampling (or other type) de-multiplexer 130.

The 1:N charge domain sampling (or other type) de-multiplexer 130 includes a sampler that is fed by a sampler clock signal and a 1 to N de-multiplexer.

The charge domain sampling de-multiplexer 130 distributes (de-multiplexes) the current signal to multiple (N) modules 140(1)-140(N). N charge memory cell and pulse width modulation modulators 40(1)-40(N) as well as N charge memory cell and pulse width modulation modulators 140(1)-140(N) are followed by a processor 70 (such as but not limited to logic state machine) that processes their outputs to provide an output ADC signal.

Processor 70 may be configured to re-order the digital outputs and can also do tasks related to calibration that are done in the digital domain.

FIG. 1 also illustrates a calibration engine 60 that is arranged to calibrate the different analog circuits—for example to equalize the offsets, gains and bandwidths and any other parameters of the different charge memory cells and/or of the PWM modulators—or any other circuit of the ADC.

FIG. 1 also illustrates a multi-phase oscillator and interpolator 50 that may generate multiple clock phases. The multi-phase oscillator and interpolator 50 may include a phase lock loop (PLL) such as but not limited to the PLL of "A 1.25-GHz 0.35-_m Monolithic CMOS PLL Based on a Multiphase Ring Oscillator", L. Sun and T. A. Kwasneiwski, IEEE Journal of solid-state circuits, Volume 36, number 6, June 2001. The multi-phase oscillator and interpolator 50 may also include counters such as counter A 85, Counter B 86 and counter C 87 of FIG. 3 that are about 120 degrees phased shifted from each other. Implementations are possible that contain Nc>=3 counters that are shifted about 360/Nc degrees from each other.

The number of clock phases generated by the multi-phase oscillator and interpolator 50 may be, for example 124. The clock phases may be single ended or differential.

FIG. 3 illustrates circuits of ADC 10 according to an embodiment of the invention.

Multi-phase oscillator and interpolator 50 includes differential multi-phase ring oscillator 52 that outputs positive clock phases php and negative clock phases phn to interpolator 54 that increases (using interpolation) number of positive and negative clock phases (phip and phin).

There are N clock phase sampler module 80(1)-80(N).

Each clock phase sampler module (such as 80(1)) is fed with each positive and negative clock phases and the clock phase sampler module reconstructs a clock signal—and may output the start and end points of the clock signal—fine_start and fine_end. For example—clock phase sampler module 80(1) may include sampling latches 81(1) as well as thermo encoders 82(1) and 83(1).

The latches sample the clock phases on the rising (start) edge of the PWM pulse and respectively on the falling (end) edge of the PWM pulse. The position of the one to zero transition sampled in the latches is indicative of the phase of the clocks at the moment the PWM edge occurs.

It should be noted that implementations that use single ended clock phases are possible. However, the use of low swing differential signaling for the clock phases has signal integrity, speed and power advantages.

Thermometer encoders 82 and 83 are fed with thermo_start and thermo_end respectively.

Figure 8:
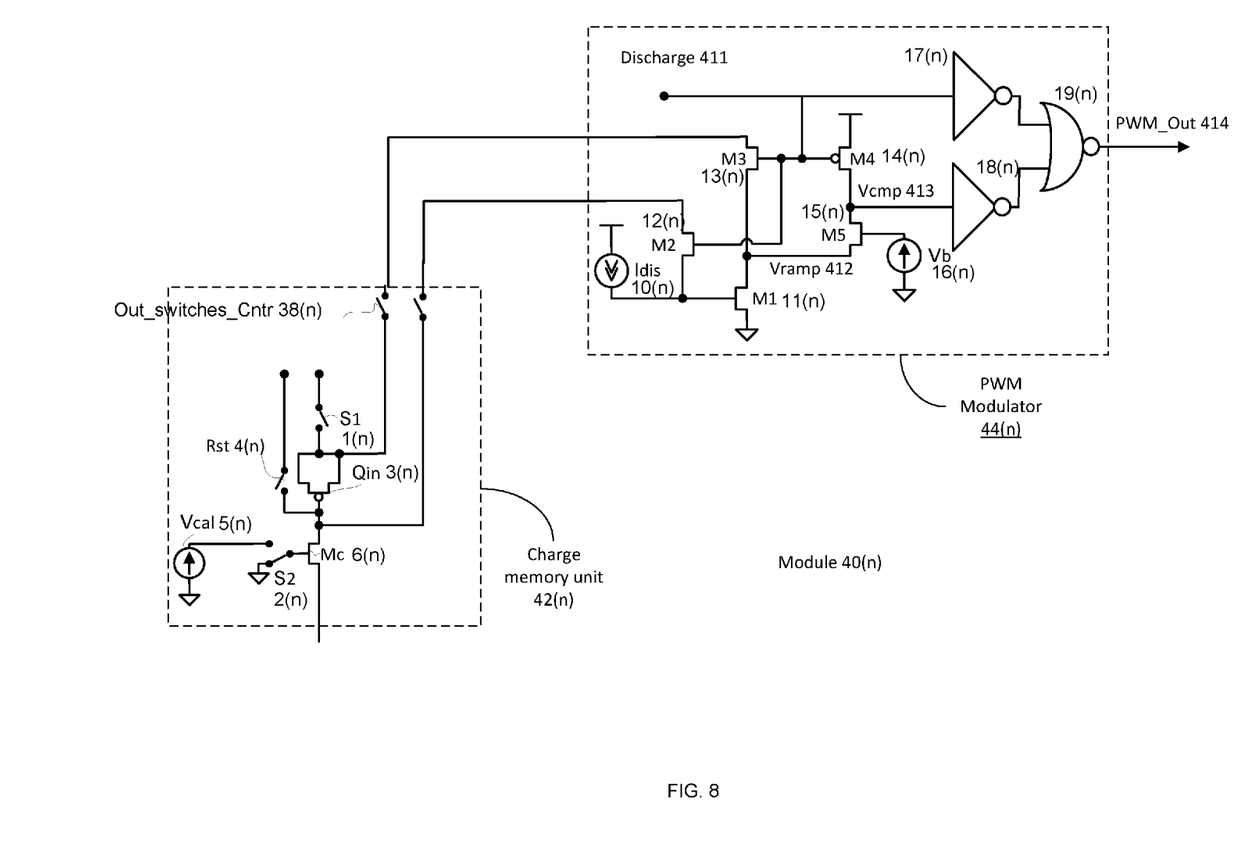
FIG. 8 illustrates circuits of an analog to digital converter according to an embodiment of the invention.

When using the PWM modulator of FIG. 8, "Start" latches are triggered by the rising edge of the PWM pulse, "end" latches by the falling edge of the pulse. When using the PWM modulator of FIG. 10, then the start latches are triggered by the rising edge of Discharge signal while the end latches are triggered by the rising edge of PWM_Out signal.

Three clock phases that are phase shifted by about 120 degrees from each other are fed to three counters—counter A 85, counter B 86 and counter C 87. The phase shift guarantees that for any possible position of the "start" and respectively "end" events (see above), at least one of the sampling latches that sample the counters is not affected by metastability (neither at start nor at end).

The three counters are coupled to N coarse processing circuits 72(1)-72(N).

Each coarse processing circuit includes three sampling latches (one sampling latch for each of the three counters). The three sampling of each first processing circuit is fed by a PWM pulse from a single charge memory cell and pulse width modulation modulator—so that the three sampling latches of the n'th first processing circuit count the number of counter counts during a PWM pulse—for each of the three counters. The same pulse also feeds the sampling latches of the clock phases of the clock phase sampling modules.

For example—coarse processing circuit 72(1) includes three sampling latches 75(1), 76(1) and 77(1). The three sampling latches are fed by the output signal (Vout_cmu 310(1)) from CM and PWM Mod 40(1). Each sampling latch includes two latches—one for sampling the "start" event and one for sampling the "end" event.

Sampling latch 75(1) samples the value of Counter A 85 at the "start" event and at the "end" event that are defined by the PWM 40(1).

Sampling latch 76(1) samples the value of Counter B 86 at the "start" event and at the "end" event that are defined by the PWM 40(1).

Sampling latch 77(1) samples the value of Counter C 87 at the "start" event and at the "end" event that are defined by the PWM 40(1).

The N coarse sampling circuits 72(1)-72(N) output output N sets of signals—count_a_start, count_a_end, count_b_start, count_b_end, count_c_start, and count_c_end. These signals are used by the N fine processing circuits 73(1)-73(N) to determine the coarse part of the digital output value. "Coarse" refers here to number of clock cycles, the "fine" refers to the phase difference within the cycle. Suppose we run the clocks at 5 GHz, 1 cycle is 200 ps and that is sub-divided by the 124 phases into ~1.5 ps time units that correspond to the LSB of the ADC.

These N sets of signals are processed by fine processing circuits 73(1)-73(N) to determine the value of Vin'.

The N modules 40(1)-40(N) are controlled by N sets of control signals (from controllers 44(1)-44(N)). The N sets of control signals shifted from each other so that different charge memory units receive charge packets from different current pulses.

The N fine processing circuit 73(1)-73(N) may precede processor 70.

Fine processing circuit 73 may perform counter correction, meta-stability avoidance and wrap-around correction. This involves selecting which counter to choose out of counter A, B and C—which amount to selecting which pair of signals (count_a_start, count_a_end), (count_b_start, count_b_end) and (count_c_start, and count_c_end) does not reflect a value of a counter (A, B and C respectively) that occurred when the latch was metastable. The digital values fine_start and fine_end define the positions of phip_start and phip_end in FIG. 4. The counters A, B, C are never metastable as they are free running. Metastability can occur in the sampling latches if they sample the output of the counters on the transition edge. Counter A transitions in this example on phip0, counter B on phip40 and counter C on phip80. The start and end events can hit (or be close to) only 2 out of these 3 phases so the ADC chooses the counter that corresponds to a phase that is farthest from the two hit points.

The value in a sampling latch can be affected by meta-stability if the phase of the start event or end event as determined by the thermo encoders 82 and 83 is in the vicinity of the phase connected to the counter that is sampled by the latch.

The wrap-around correction may occur when the events are in the order "start", counter edge, "end" and then the value needs to be decremented. The value is correct if the order is "start", "end", counter edge. A wrap-around correction may involve decrementing a count if the counter edge is on the arc from "start" to "end" drawn in the positive direction.

Figure 4:
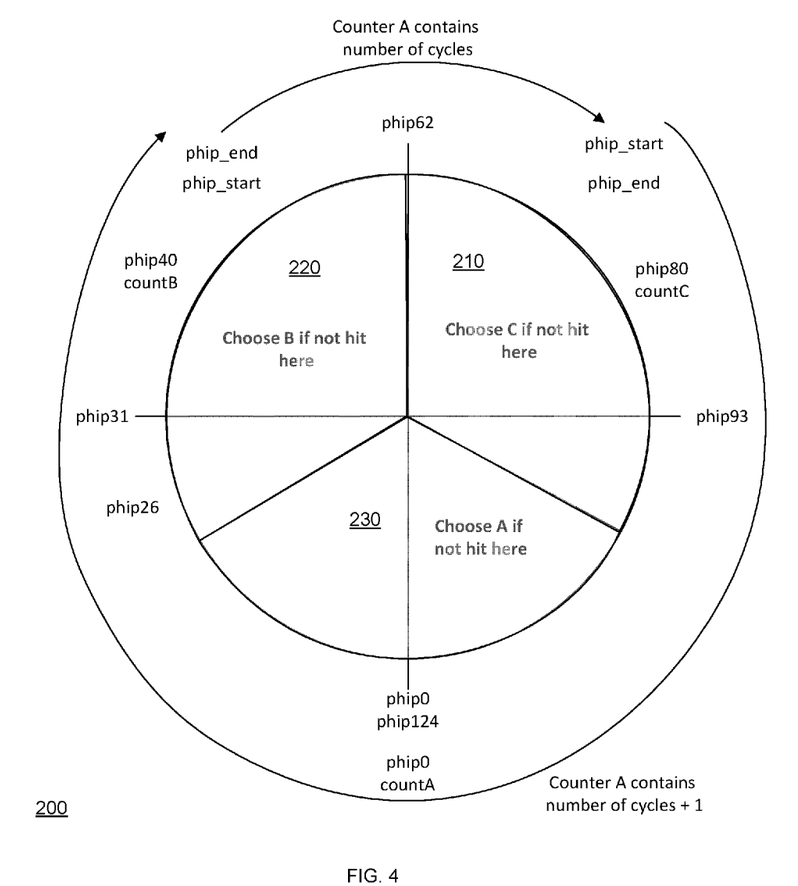
FIG. 4 illustrates various clock phases and decisions related to the various clock phases according to an embodiment of the invention.

The warp-around correction and the meta-stability avoidance is illustrated in FIG. 4—illustrating three phase regions 210, 220 and 230—each "covers" a phase region of about 120 degrees—wherein the different regions are associated with meta-stability of the three counters.

The wrap around correction is illustrates by two scenarios—in one the difference between count_a_end and count_a_start provides the correct number of cycles—an in another the difference between count_a_end and count_a_start should be decremented by one to provide the correct number of cycles.

The fine bits are computed simply by the phase difference between the samplings at the start and at the end of the PWM pulse: Nfine=$\mod_{Nip}$(phip_end+Nip−phip_start)

Figure 11:
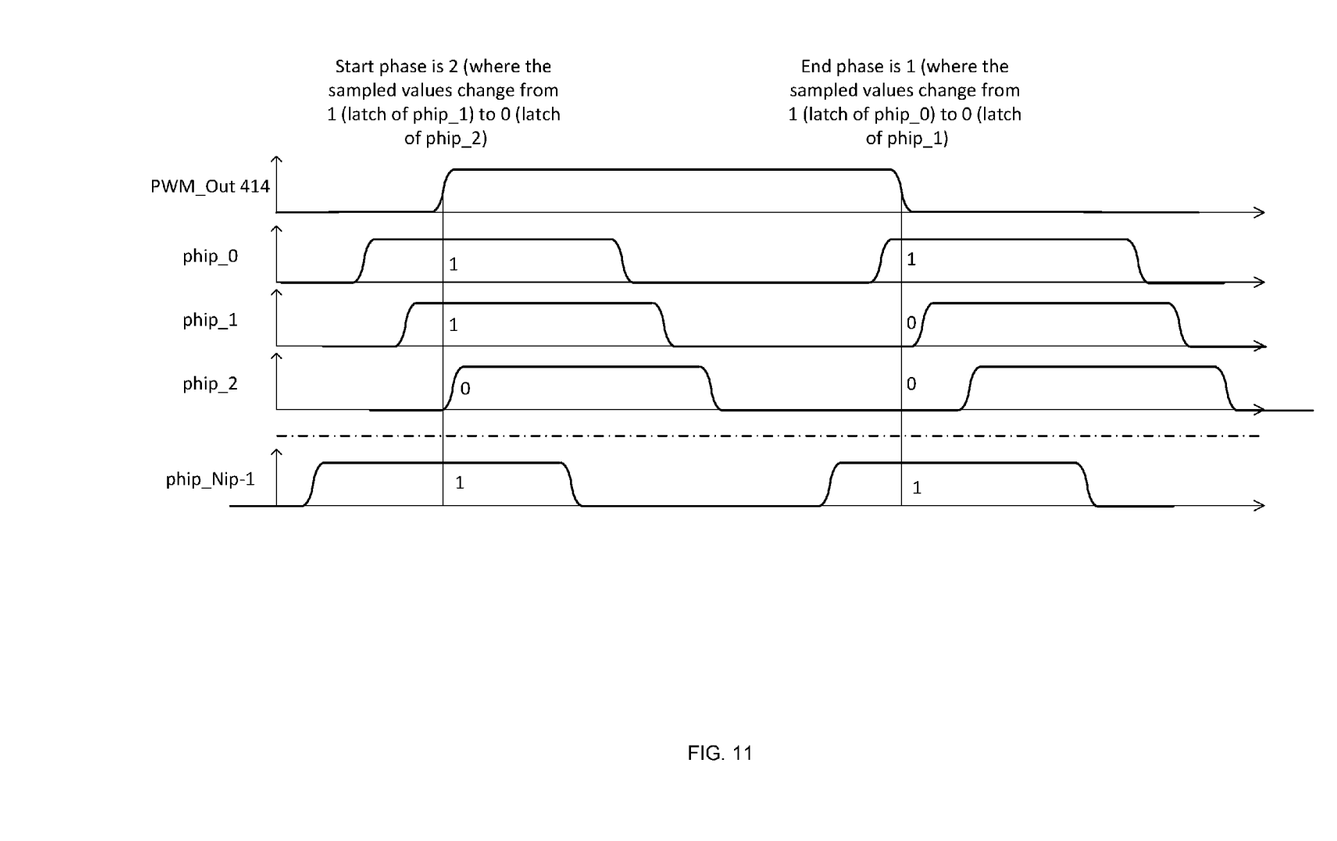
FIG. 11 illustrates a timing diagram of signals generated by circuits of an analog to digital converter according to an embodiment of the invention.

Nip is the number of interpolated phases (31×4=124 in the example). phip_end and phip_start are the outputs of the thermo decoders. In FIG. 11 the different phases are denoted phip_0 till phip_Nip−1

The coarse bits are computed (by each first processing circuit) as the number of cycles from the count difference sampled at the beginning and end of the PWM pulse. The counters count the number of rising edges that fall within the PWM pulse. The sampling of the counters can be affected by metastability if the edge of the PWM pulse (rising or falling) coincides with the rising edge of the phase associated with the counter. As the PWM pulse has only 2 edges, at most 2 counters can be simultaneously affected by metastability so that this guarantees that we always have at least one clean counter.

As shown in FIG. 4, the output of the chosen counter has to be decremented in case the phase associated with the chosen counter falls between the start phase and the end phase (in the positive counting direction).

Figure 5:
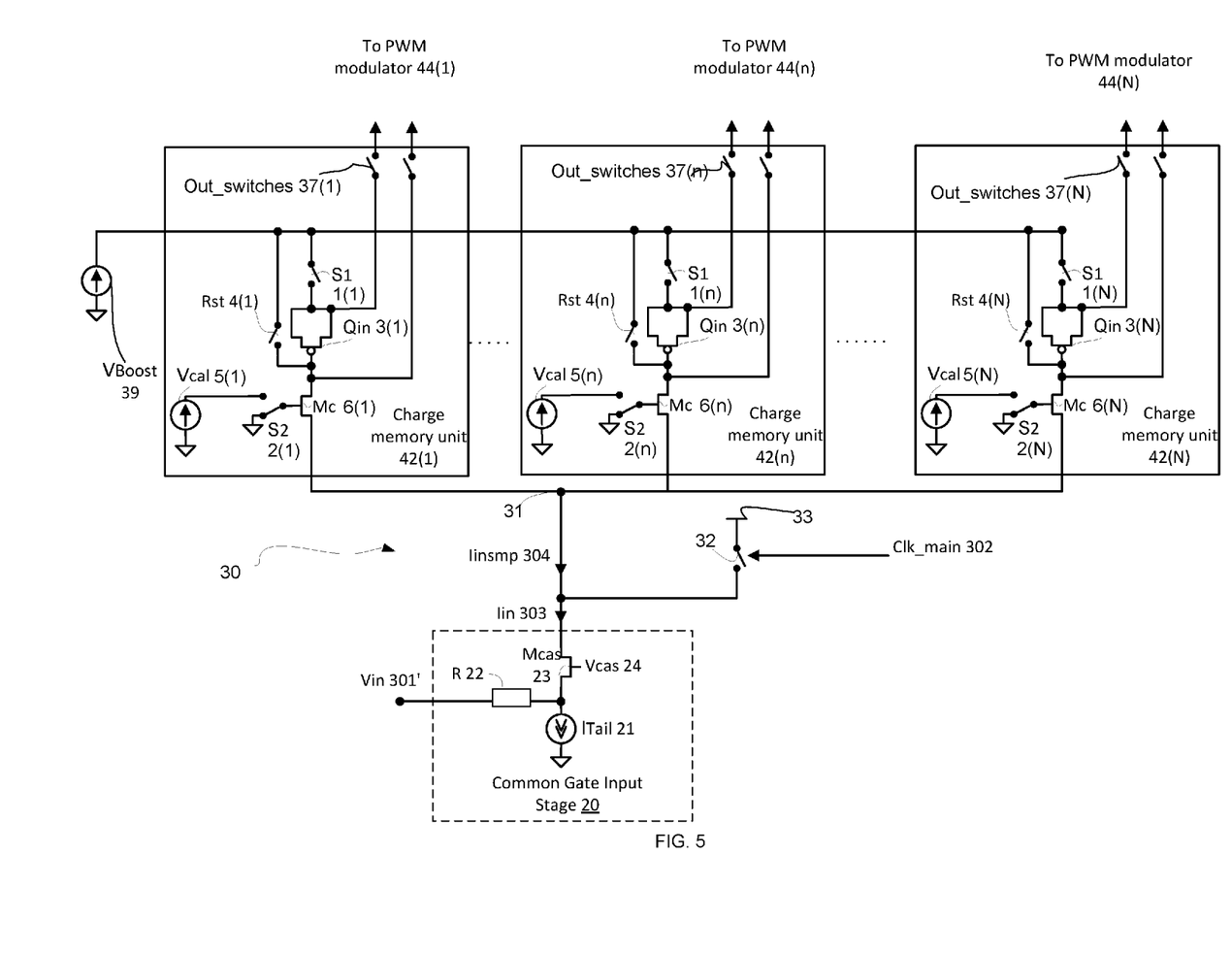
FIG. 5 illustrates circuits of an analog to digital converter according to an embodiment of the invention.

The output from each fine processing circuit 73(n) is then computed as: Dout=dcoarse*Nip+Nfine FIG. 5 illustrates common gate input stage 20, 1:N charge domain sampling de-multiplexer 30 and N charge memory cells 42(1)-42(N) of N modules 40(1)-40(N).

Common gate input stage 20 receives Vin' 301 and converts Vin' 301 to a current signal that is fed to 1:N charge domain sampling de-multiplexer 30.

The 1:N charge domain sampling de-multiplexer 30 includes sampler (such as switch 32 that is coupled to a positive potential 33) and is fed by a sampler clock signal Clk_main 302.

The 1:N charge domain sampling de-multiplexer 30 also includes 1 to N de-multiplexer 31 that is coupled in parallel to N charge memory cells 42(1)-42(N).

Common gate input stage 20 includes an input port for receiving Vin 301', a resistor R 22 that is connected between the input port and a node. The node is connected to a reference current source ITail 21 and to a transistor Mcas 23 that has a gate that is controlled by control signal Vcas 24.

Iin 303 is drained by transistor Mcas 23 when the transistor is open.

The common gate input stage 20 performs the conversion of Vin 301' to current, governed by the following basic linear equation:

$$Iin=Itail-(Vin-Vcas-VgsMcas)/R$$

Various techniques (not shown here) can be employed to correct the non-linear effects that are associated with this circuit. These techniques may be applied by calibration engine 60 of FIG. 1.

The input signal Iin 303 is sampled by sampler that steers away the current to positive supply 33 using switch 32 that is controlled by the clock Clk_main.

The sampler converts the input signal Iin 303 to a series of current pulses Iinsmp 304, and the charge (time integral) of each current pulse containing the information of one input signal sample is received by one of the charge memory banks.

Each charge memory unit may store the charge on linear capacitors or on non-linear MOS capacitors as shown in FIG. 5. The use of MOS capacitors has the advantage of lower kTC noise associated with the signal sampling and the storage reset performed here.

The fact that the switches of the charge memory units are operated in the time intervals when Iinsmp is 0 (between current pulses) prevents the timing of these events to affect the sampling instances that are solely defined by Clk_main.

Each one of the charge memory cells includes first switch, second switch, a charge memory element (such as transistor Qin), reset switch, input transistor Mc, calibration voltage source Vcal, and output ports.

Charge memory unit 42(1) includes first switch S1 1(1), second switch S2 2(1), charge memory element Qin 3(1), reset switch Rst 4(1), input transistor Mc 6(1), Vcal 5(1), and output ports for outputting an output signal to PWM modulator 44(1) by closing output switches 37(1) using control signals out_switches_Cntr 38(1).

Charge memory unit 42(n) includes first switch S1 1(n), second switch S2 2(n), charge memory element Qin 3(n), reset switch Rst 4(n), input transistor Mc 6(n), Vacl 5(n), and output ports for outputting the charge packet. The charge packet is outputted to PWM modulator 44(n). The charge packet is outputted to PWM modulator 44(n) by closing output switches 37(n) using control signals out_switches_Cntr (denoted 38(n) in FIG. 6)).

Variable n may range between 1 and N.

Figure 6:
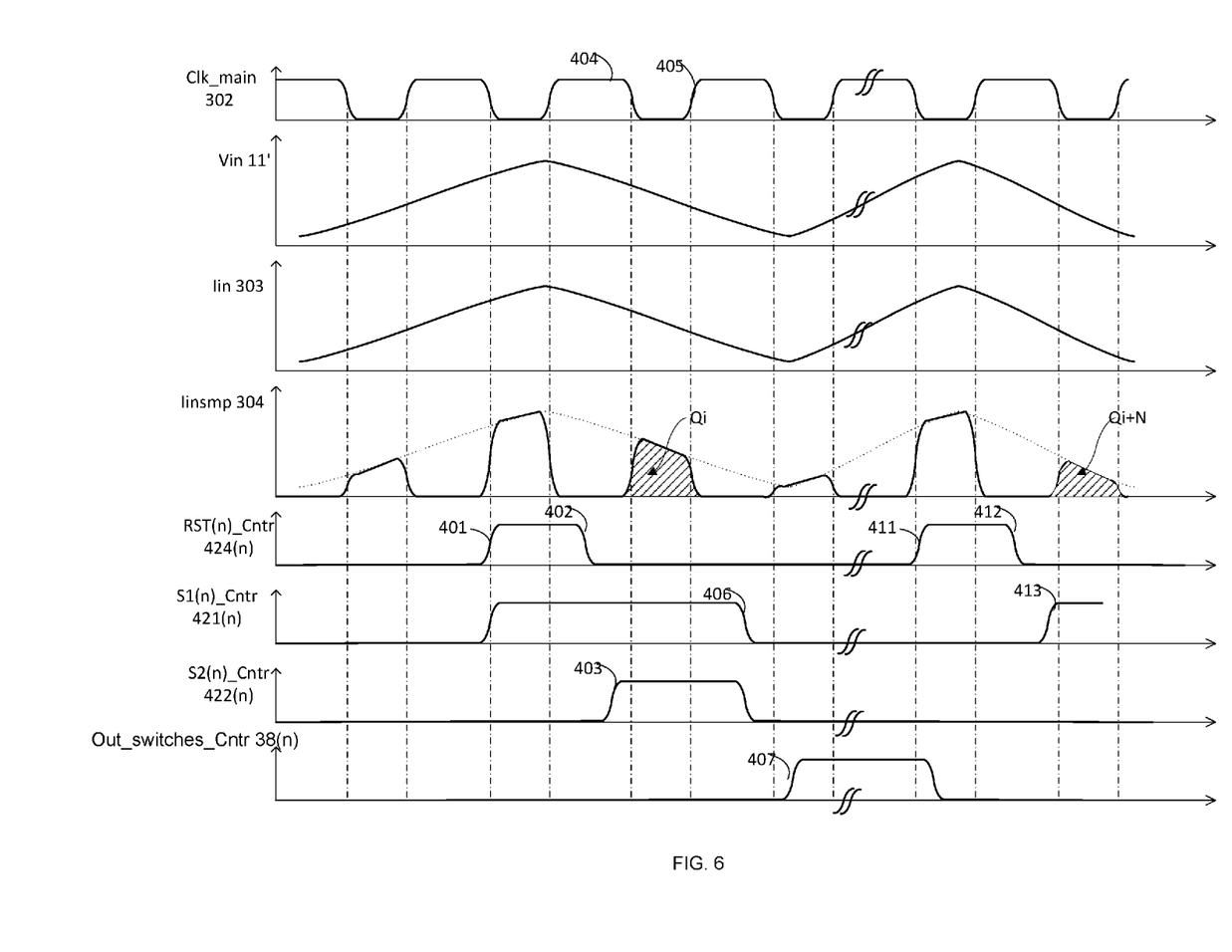
FIG. 6 illustrates a timing diagram of signals generated by circuits of an analog to digital converter according to an embodiment of the invention.

The operating sequence for charge memory unit 42(n) is shown in FIG. 6.

Reset switch Rst 4(n) is controlled by control signal Rst(n)_Cntr 424(n). First switch 1(n) is controlled by control signal S1(n)_Cntr 421(n). Second switch 2(n) is controlled by control signal S2(n)_Cntr 422(n).

The operating sequence includes:
a. The charge memory unit n is reset (401). S1(n) 1(n) and RST(n) 4(n) are closed.
b. The reset ends (402) at the opening of Rst(n) 4(n).
c. The charge memory unit 42(n) is connected to the sampled input current by closing (403) S2(n).
d. The integration of the input sample starts with the opening (404) of the Sampler switch 32.
e. The integration of the input sample ends with the closing (405) of the Sampler switch.
f. Charge memory unit 42(n) is disconnected (406) from the input circuit by opening of switches S1(n) 1(n) and S2(n) 2(n).
g. Charge memory unit 42(2) is connected (407) to the PWM modulator 44(n) by closing output switches 37(n)-by out_switches_Cntr 38(n).

Figure 7:
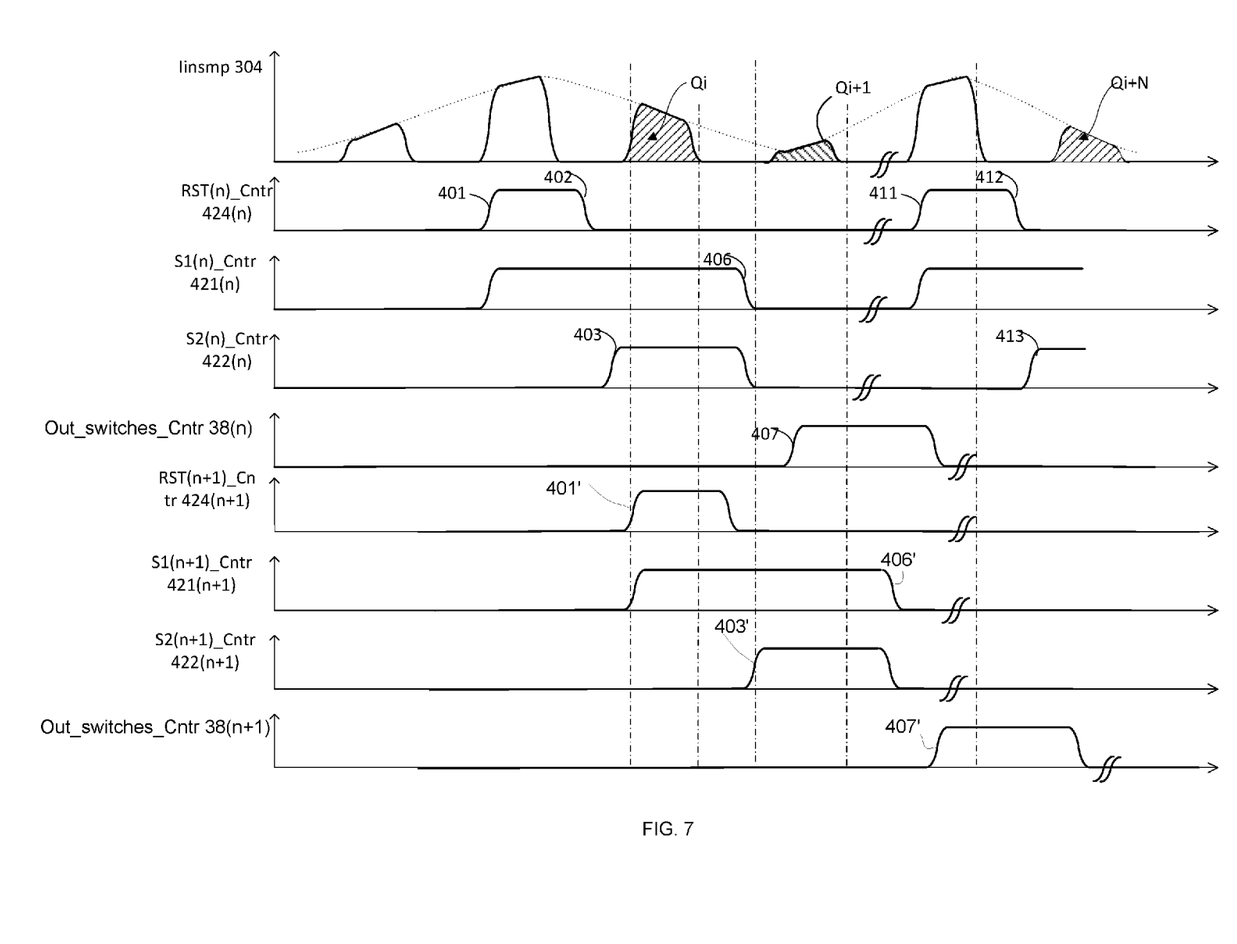
FIG. 7 illustrates a timing diagram of signals generated by circuits of an analog to digital converter according to an embodiment of the invention.

The operating sequence for charge memory unit 42(n) and for another charge memory unit 42(n+1) is shown in FIG. 7. FIG. 7 illustrates that charge memory unit 42(n+1) is activated at the same manner as charge memory unit 42(n)—but samples the next current pulse Qi+1. See events 401', 402', 402', 406' and 407' that correspond to events 401, 402, 402, 406 and 407—but one current pulse later.

FIG. 8 illustrates a charge memory unit 42(2) and a PWM modulator 44(n).

PWM modulator 44(n) includes current source Idis 10(n), first transistor M1 11(n), second transistor M2 12(n), third transistor M3 13(n), fourth transistor M4 14(n), fifth transistor M5 15(n), discharge port for receiving a discharge signal 411, bias voltage source Vb 16(n), inverter 18(n), inverter 17(n), nor gate 19(n) and an output port for outputting output PWM pulse PWM_Out 414 (see a timing diagram of FIG. 11).

Second transistor M2 12(n) and third transistor M3 13(n) operate as switches connecting the charge memory capacitor in the feedback loop between the gate and drain of the first transistor M1 1(n) that operates as an integrating device M1. Fourth transistor M4 11(4) and fifth transistor M5 15(n) form a pre-charged comparator stage, the trigger point of which is set by Vb-VthM5. Inverters 17(n) and 18(n) and nor gate 19(n) output the output PWM pulse.

Figure 9:
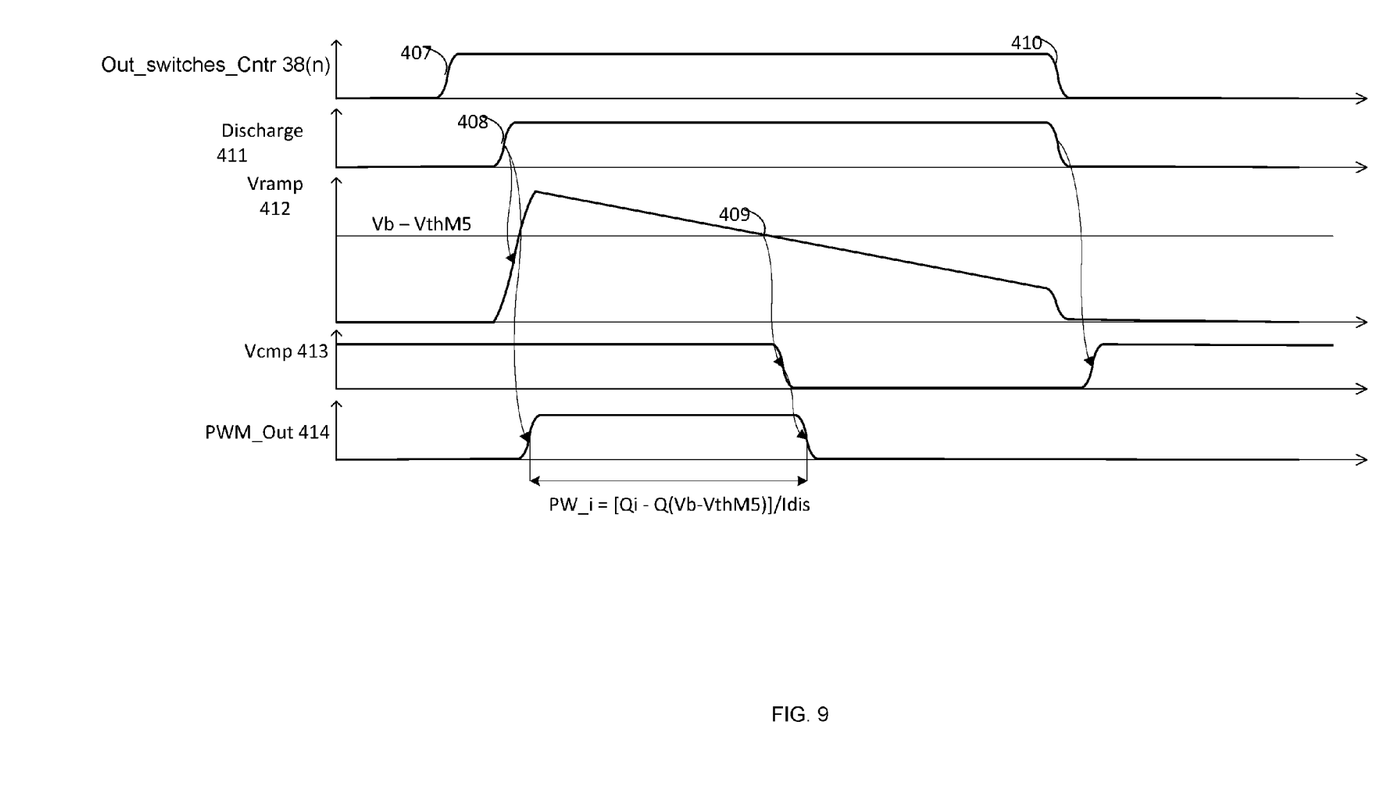
FIG. 9 illustrates a timing diagram of signals generated by circuits of an analog to digital converter according to an embodiment of the invention.

The operating sequence presented in FIG. 9 is the continuation of the sequence discussed in FIG. 6 and is as follows:
a. The charge packet starts (408) the discharge process at the rising edge of Discharge signal 411 (407). This also creates the start of the output PWM pulse.
b. When the ramp voltage discharges to the trigger point of the pre-charged comparator (that is Vb-VthM5) transistor M5 starts (409) to conduct and discharges the dynamic node of the comparator Vcmp. This marks the end of the PWM pulse.
c. The charge memory is disconnected (410) from the PWM circuit (opening Out_switches 37(n) and driving the Discharge signal low).
d. On FIG. 6 the charge memory unit is now reset (411), it's reset ends (412) and is opened to receive the next charge packet Qi+N (413).

It should be noted that implementations might be possible in which the functionality of the output switches of the charge memory cell 42(n) performed by M3 and M2 and there is no need for the output switches.

Figure 10:
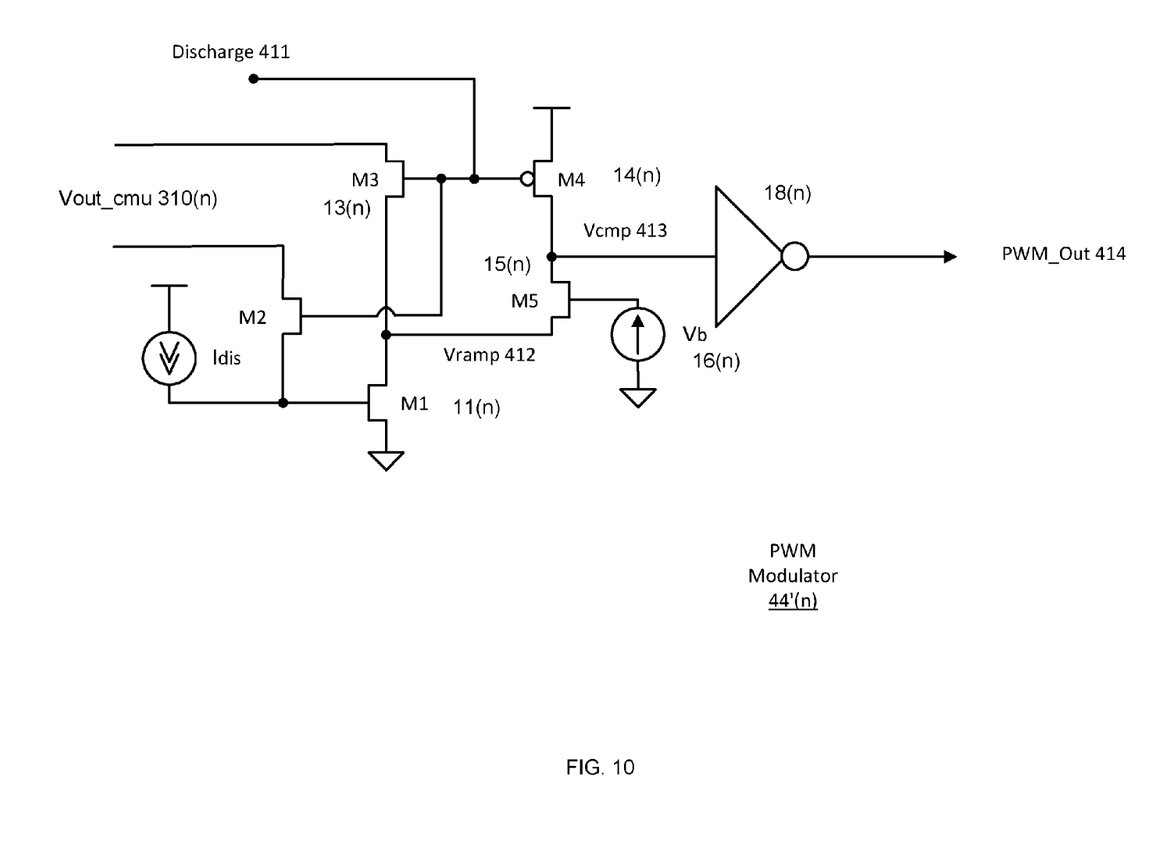
FIG. 10 illustrates a circuit of an analog to digital converter according to an embodiment of the invention.

FIG. 10 illustrates a PWM modulator 44'(n) that differs from the PWM modulator 44(n) of FIG. 8 by not including inverter 18(n) and nor gate 19(n).

Figure 12:
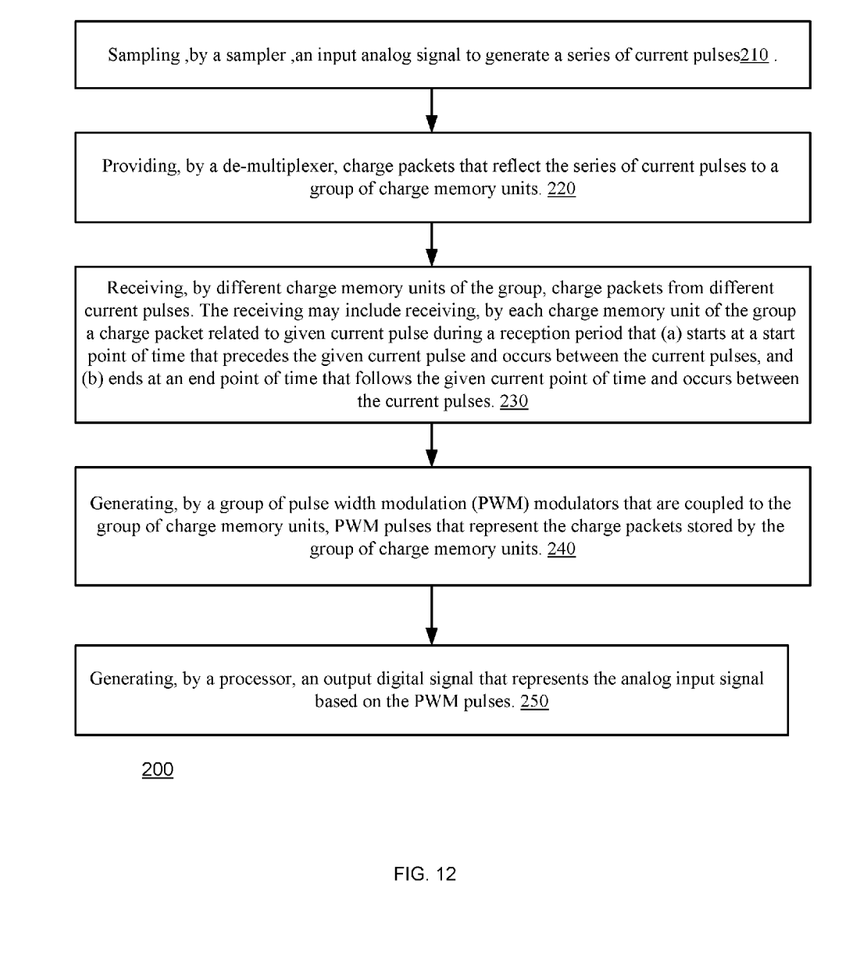
FIG. 12 illustrates a method according to an embodiment of the invention.

FIG. 12 illustrates method 300 that includes:
a. Step 210 of sampling, by a sampler, an input analog signal to generate a series of current pulses. The input analog signal may be an input analog current or an input analog voltage.
b. Step 220 of providing, by a de-multiplexer, charge packets that reflect the series of current pulses to a group of charge memory units. The group of charge memory units may include non-linear MOS capacitors or any other charge memory components.
c. Step 230 of receiving, by different charge memory units of the group, charge packets from different current pulses. The receiving may include receiving, by each charge memory unit of the group a charge packet related to given current pulse during a reception period that (a) starts at a start point of time that precedes the given current pulse and occurs between the current pulses, and (b) ends at an end point of time that follows the given current point of time and occurs between the current pulses.
d. Step 240 of generating, by a group of pulse width modulation (PWM) modulators that are coupled to the group of charge memory units, PWM pulses that represent the charge packets stored by the group of charge memory units.

e. Step 250 of generating, by a processor, an output digital signal that represents the input analog signal based on the PWM pulses.

The series of current pulses may be proportional to the input analog signal.

Step 210 may include generating the series of the current pulses in synchronicity with a sampler clock.

Step 210 may include sampling by the sampler the input analog signal under a control of a sampler clock signal. Method 200 may include controlling by at least one controller the group of charge memory units to perform the receiving using charge memory unit control signals.

The edges of the sampler clock may occur at different points of time than edges of control signals of the charge memory cells.

Step 210 may include (or may be preceded by) receiving by an input stage an input analog voltage and converting, by the input stage, the input analog voltage to the input analog current.

Step 250 may include feeding a set of counters by clock phases that are phase shifted from each other, and generating by each processing circuit of group of processing circuits a set of measurements of a duration of a PWM pulse based on the values of the set of counters. The clock phases may include N clock phases that are phase shifted by about 360/N degrees from each other, where N is a positive integer that exceed two.

The processing circuits are first processing circuits and are coupled to second processing circuits. Step 250 may include performing by the second processing circuits metastability avoidance and wrap-around correction.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Any reference to any of the terms "comprise", "comprises", "comprising" "including", "may include" and "includes" may be applied to any of the terms "consists", "consisting", "consisting essentially of". For example—any of the circuits illustrated in any figure may include more components that those illustrated in the figure, only the components illustrated in the figure or substantially only the components illustrate din the figure.

Also for example, in one embodiment, the illustrated examples may be implemented as circuitry located on a single integrated circuit. Alternatively, the examples may be implemented as any number of separate integrated circuits or separate common mode noise chokes interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An analog to digital converter comprising:
   a sampler that is configured to sample an input analog signal to generate a series of current pulses;
   a group of charge memory units;
   a de-multiplexor that is configured to provide charge packets that reflect the series of current pulses to the group of charge memory units;
   at least one controller for controlling the group of charge memory units thereby causing different charge memory units of the group to receive charge packets from different current pulses; wherein each charge memory unit is configured to receive a charge packet related to given current pulse during a reception period that (a) starts at a start point of time that precedes the given current pulse and occurs between the current pulses, and (b) ends at an end point of time that follows the given current point of time and occurs between the current pulses;

a group of pulse width modulation (PWM) modulators that are coupled to the group of charge memory units and are configured to generate PWM pulses that represent the charge packets stored by the group of charge memory units; and a processor that is configured to generate an output digital signal that represents the analog input signal based on the PWM pulses.

2. The analog to digital converter according to claim 1 wherein the series of current pulses are proportional to the input analog signal.

3. The analog to digital converter according to claim 1 wherein the series of the current pulses are generated in synchronicity with a sampler clock.

4. The analog to digital converter according to claim 1 wherein the sampler is configured to sample the input analog signal under a control of a sampler clock signal; and wherein the at least one controller is configured to control the group of charge memory units using charge memory unit control signals.

5. The analog to digital converter according to claim 4 wherein edges of the sampler clock occurs at different points of time than edges of control signals of the charge memory cells.

6. The analog to digital converter according to claim 1 further comprising an input stage that receives an input analog voltage and converts the input analog voltage to the input analog current.

7. The analog to digital converter according to claim 1 further comprising a set of counters that are fed by clock phases that are phase shifted from each other, and a group of processing circuits; wherein each processing circuit is configured to generate a set of measurements of a duration of a PWM pulse based on the values of the set of counters.

8. The analog to digital converter according to claim 7 wherein the clock phases comprise N clock phases that are phase shifted by about 360/N degrees from each other, where N is a positive integer that exceed two.

9. The analog to digital converter according to claim 7 wherein the processing circuits are first processing circuits and are coupled to second processing circuits that are configured to perform meta-stability avoidance and wrap-around correction.

10. The analog to digital converter according to claim 7 where the charge memory units are comprise non-linear MOS capacitors.

11. A method for analog to digital conversion, the method comprises:

sampling, by a sampler, an input analog signal to generate a series of current pulses;

providing, by a de-multiplexer, charge packets that reflect the series of current pulses to a group of charge memory units;

receiving, by different charge memory units of the group, charge packets from different current pulses; wherein the receiving comprises receiving, by each charge memory unit of the group a charge packet related to given current pulse during a reception period that (a) starts at a start point of time that precedes the given current pulse and occurs between the current pulses, and (b) ends at an end point of time that follows the given current point of time and occurs between the current pulses;

generating, by a group of pulse width modulation (PWM) modulators that are coupled to the group of charge memory units, PWM pulses that represent the charge packets stored by the group of charge memory units; and generating, by a processor, an output digital signal that represents the analog input signal based on the PWM pulses.

12. The method according to claim 11 wherein the series of current pulses are proportional to the input analog signal.

13. The method according to claim 1 comprising generating the series of the current pulses in synchronicity with a sampler clock.

14. The method according to claim 1 comprising sampling by the sampler the input analog signal under a control of a sampler clock signal; and controlling by at least one controller the group of charge memory units to perform the receiving using charge memory unit control signals.

15. The method according to claim 14 wherein edges of the sampler clock occurs at different points of time than edges of control signals of the charge memory cells.

16. The method according to claim 1 comprising receiving by an input stage an input analog voltage and converting, by the input stage, the input analog voltage to the input analog current.

17. The method according to claim 11 comprising feeding a set of counters by clock phases that are phase shifted from each other, and generating by each processing circuit of group of processing circuits a set of measurements of a duration of a PWM pulse based on the values of the set of counters.

18. The method according to claim 17 wherein the clock phases comprise N clock phases that are phase shifted by about 360/N degrees from each other, where N is a positive integer that exceed two.

19. The method according to claim 17 wherein the processing circuits are first processing circuits and are coupled to second processing circuits wherein the method comprises performing by the second processing circuits meta-stability avoidance and wrap-around correction.

20. The method according to claim 17 where the charge memory units comprise non-linear MOS capacitors.

* * * * *